(12) United States Patent
Kim et al.

(10) Patent No.: US 8,118,624 B2
(45) Date of Patent: Feb. 21, 2012

(54) LEAD PLATE WITH A JOINT PORTION HAVING A SURFACE AREA SMALLER THAN THAT OF ITS MOUNTING PORTION

(75) Inventors: Bong-Young Kim, Yongin-si (KR); Young-Ho Kim, Yongin-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/923,563

(22) Filed: Sep. 28, 2010

(65) Prior Publication Data

US 2011/0151730 A1     Jun. 23, 2011

(30) Foreign Application Priority Data

Dec. 17, 2009   (KR) .................. 10-2009-0126076

(51) Int. Cl.
    *H01R 9/24* (2006.01)
(52) U.S. Cl. ..................................................... 439/884
(58) Field of Classification Search .................. 439/884, 439/66, 500, 83, 62; 172/262, 260; 429/100, 429/121, 122; 361/502–512
    See application file for complete search history.

(56) References Cited

U.S. PATENT DOCUMENTS

| | | | |
|---|---|---|---|
| 6,676,440 B1 * | 1/2004 | Inamine et al. | 439/500 |
| 7,916,452 B2 * | 3/2011 | Tasei et al. | 361/502 |
| 2008/0226974 A1 | 9/2008 | Jang et al. | |
| 2008/0236880 A1 * | 10/2008 | Ozaki et al. | 174/262 |
| 2009/0154048 A1 * | 6/2009 | Jang et al. | 361/106 |
| 2009/0246611 A1 * | 10/2009 | Kim | 429/122 |
| 2009/0258283 A1 * | 10/2009 | Kim | 429/62 |
| 2009/0280398 A1 * | 11/2009 | Park et al. | 429/100 |
| 2009/0305117 A1 | 12/2009 | Koh et al. | |
| 2009/0305119 A1 | 12/2009 | Kim | |

FOREIGN PATENT DOCUMENTS

| | | |
|---|---|---|
| EP | 2073295 A2 | 6/2009 |
| JP | 2007-335113 A | 12/2007 |
| KR | 10-2008-0109948 A | 12/2008 |
| KR | 10 2009-0090546 A | 8/2009 |
| WO | WO 2009/069673 A1 | 6/2009 |

OTHER PUBLICATIONS

European Search Report in EP 10195485.7-2210, dated Mar. 16, 2011.

* cited by examiner

*Primary Examiner* — Chandrika Prasad
(74) *Attorney, Agent, or Firm* — Lee & Morse, P.C.

(57) ABSTRACT

A lead plate for connecting a printed circuit board (PCB) of a secondary battery to an bare cell includes a mounting portion connected to the PCB, a joint portion connected to the bare cell, a surface area of the joint portion facing the bare cell being smaller than a surface area of the mounting portion facing the PCB, and a step portion connecting the mounting portion and the joint portion to each other.

20 Claims, 9 Drawing Sheets

LEAD PLATE WITH A JOINT PORTION HAVING A SURFACE AREA SMALLER THAN THAT OF ITS MOUNTING PORTION

BACKGROUND

1. Field

Example embodiments relate to a lead plate of a secondary battery and a protection circuit module having the same. More particularly, example embodiments relate to a lead plate and a protection circuit module having the same, which can enhance the performance and reliability of a secondary battery by improving the assembled structure of the secondary battery.

2. Description of the Related Art

A secondary battery is a battery that can be repeatedly charged and discharged. Secondary batteries may be classified into nickel-cadmium (Ni—Cd) secondary batteries, nickel-hydrogen (Ni-MH) secondary batteries, lithium secondary batteries, and the like. For example, lithium secondary batteries may be divided into lithium ion secondary batteries using a liquid electrolyte and lithium polymer secondary batteries using a polymer electrolyte, depending on the kind of electrolyte used. In addition, the lithium secondary batteries may be divided into a prismatic type, a cylinder type, a pouch type, and the like, depending on their shapes.

A battery pack using a lithium secondary battery may typically include a bare cell and a protection circuit module. The bare cell refers to a basic structure of the battery, including an electrode assembly, an electrolyte, and an outer case in which the electrode assembly and the electrolyte are accommodated. The protection circuit module (PCM) protects the bare cell from overcharge or overdischarge when the bare cell is charged or discharged.

SUMMARY

Embodiments are therefore directed to a lead plate of a secondary battery and a protection circuit module, which substantially overcome one or more of the problems due to the limitations and disadvantages of the related art.

It is therefore a feature of an embodiment to provide a lead plate having a structure capable of enhancing a joint strength between a protection circuit module and a bare cell.

It is therefore another feature of an embodiment to provide a protection circuit module having the aforementioned lead plate, which can facilitate a laser soldering process, reduce failures in a joining process, and enhance reliability of a battery.

At least one of the above and other features and advantages may be realized by providing a lead plate for connecting a printed circuit board (PCB) of a secondary battery to an bare cell, the lead plate including a mounting portion connected to the PCB, a joint portion connected to the bare cell, a surface area of the joint portion facing the bare cell being smaller than a surface area of the mounting portion facing the PCB, and a step portion connecting the mounting portion and the joint portion to each other.

In one embodiment, the mounting portion is divided into a contact region at which it comes in contact with one surface of the protection circuit module and a non-contact region, and the area of the contact region is formed smaller than that of the joint portion connected to the bare cell.

In one embodiment, the boundary portion between the mounting portion and the step portion and the boundary portion between the step portion and the joint portion are bent, and a notch is formed in at least one region of the bending portion between the mounting portion and the step portion and the bending portion between the step portion and the joint portion.

The thickness of at least one portion of the mounting portion may be greater than that of the joint portion.

The non-contact region of the mounting portion may be formed to extend outward from at least one surface of the contact region.

The width of the mounting portion may be wider than that of the joint portion.

In one embodiment, the mounting portion has a notch, and the joint portion has a punch or opening.

The non-contact region may have a wing portion bent and extended outward from the contact region. The length of the wing portion extended from the mounting portion may be shorter than that of the step portion extended between the mounting portion and the joint portion. Alternatively, the width of the wing portion may be decreased in the direction extending outward from the mounting portion so that the wing portion is spaced apart from the step portion at a predetermined interval.

At least one of the above and other features and advantages may also be realized by providing a protection circuit module including a PCB, a safety element and an external connection terminal, mounted on the PCB, and a lead plate joined with the PCB, wherein the lead plate includes a mounting portion connected to one surface of the PCB, a joint portion connected to the bare cell, and a step portion for connecting the mounting portion and the step portion to each other, wherein the area of the mounting portion is formed larger than that of the joint portion joined with the bare cell.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1A:
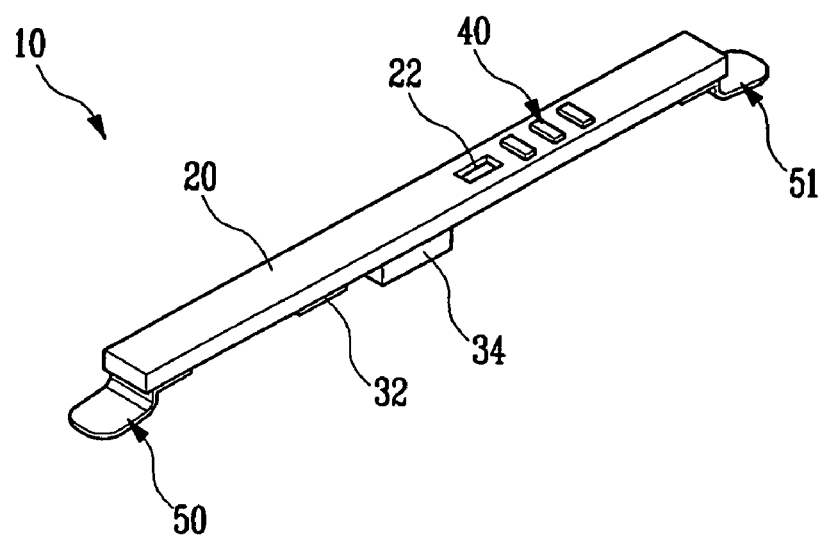
FIG. 1A illustrates a schematic perspective view of a protection circuit module according to an embodiment.

Korean Patent Application No. 10-2009-0126076, filed on Dec. 17, 2009, in the Korean Intellectual Property Office, and entitled: "Lead Plate and Protection Circuit Module Having the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of elements and regions may be exaggerated for clarity of illustration. It will also be understood that when a layer or element is referred to as being "on" another element or substrate, it can be directly on the other element or substrate, or intervening elements may also be present. In addition, it will also be understood that when an element is referred to as being "between" two elements, it can be the only element between the two elements, or one or more intervening elements may also be present. Like reference numerals refer to like elements throughout.

Figure 1B:
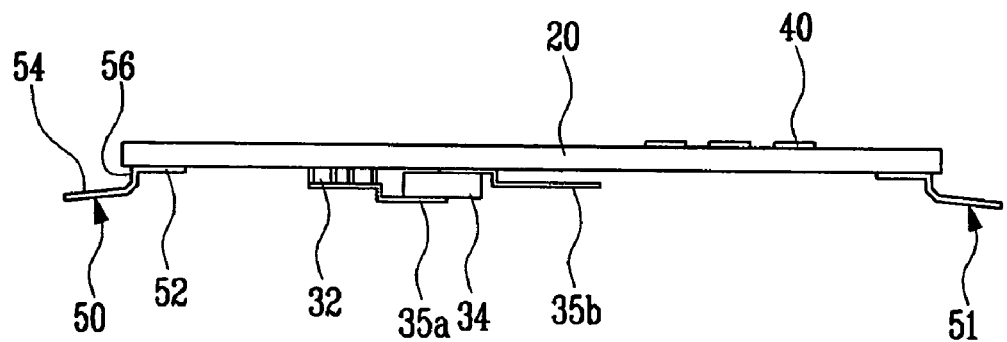
FIG. 1B illustrates a side view of the protection circuit module of FIG. 1A.

FIG. 1A illustrates a schematic perspective view of a protection circuit module according to an embodiment, and FIG. 1B illustrates a schematic side view of the protection circuit module of FIG. 1A. Referring to FIGS. 1A and 1B, the protection circuit module 10 may include a substrate 20, safety elements 32 and 34 on the substrate 20, an external connection terminal 40 on the substrate 20, and a lead plate 50 connected to the substrate 20.

The substrate 20 may include a printed circuit board (PCB) having interconnection patterns formed therein. For example, the substrate 20 (may be referred hereinafter as a "PCB") may have a shape of a plate having a length that is a few times or a few tens of time longer than its width or thickness. As illustrated in FIG. 1, the substrate 20 may be provided with a hole 22 passing through an approximate center portion thereof. When the protection circuit module 10 is joined with a bare cell, the hole 22 may be used as a passage through which a welding rod may be inserted to weld an electrode terminal (see 120 of FIG. 11A) of the bare cell and an electrode terminal, e.g., a second terminal 35b in FIG. 1B, of the safety element 34.

The safety elements 32 and 34 may refer to a protection module 32 and a temperature sensor 34. The safety elements 32 and 34 may be mounted on a first surface, i.e., a bottom surface, of the substrate 20. The protection module 32 may control the charge/discharge operation of a battery pack for which the protection circuit module 10 is used, and may protect the battery pack from overcharge, overdischarge, overcurrent, and the like. The temperature sensor 34 may include a positive temperature coefficient (PTC) thermistor. The temperature sensor 34 may be connected to the protection module 32 through a first terminal 35a, and may be connected to the electrode terminal (see 120 of FIG. 11A) of the bare cell through the second terminal 35b.

The external connection terminal 40 may be on a second surface of the substrate 20, i.e., on a surface opposite the first surface, and may form a current path between the bare cell and an external system, e.g., a load, charging system or the like, after the protection circuit module 10 is connected to the bare cell. The external connection terminal 40 may include at least two or more terminals including positive and negative terminals respectively connected to positive and negative electrodes of the bare cell. The external connection terminal 40 may be mounted on the second surface, i.e., a top surface, of the substrate 20.

The lead plate 50 may include a mounting portion mounted on a bottom surface of the substrate 20, a joint portion 54 welded to an bare cell, e.g., a bare cell, and a step portion 56 for connecting the mounting portion 52 and the joint portion 54 to each other, so that a step may be formed between the bare cell and the protection circuit module 10. In an embodiment, when the protection circuit module 10 is welded to the bare cell, the lead plate 50 may be formed to have a proper strength or elasticity for correcting a margin that may occur during the manufacturing process of the battery pack, e.g., a margin of the length of the bare cell, or the like.

In an embodiment, an area of the mounting portion 52 facing the protection circuit module 10 may be larger than an area of the joint portion 54 facing the bare cell, e.g., the bare cell, so that a weight of the mounting portion 52 in the lead plate 50 may be greater than that of the joint portion 54. Accordingly, it may be possible to prevent one side of the joint portion 54 from being inclined or lifted, e.g., separated, away from the bare cell, when a compression force is applied to join the protection circuit module 10 with the bare cell.

In contrast, if a joint portion 54 is inclined away from the surface of the bare cell to be welded, a hole may be produced by laser in the joining process, e.g., a laser welding, or the joint portion 54 may not be appropriately welded to the surface of the bare cell. As such, if the welding is performed in the state that one side of the joint portion 54 is inclined or lifted with respect to the surface of the bare cell, it may be difficult to ensure a welding strength.

Figure 2A:
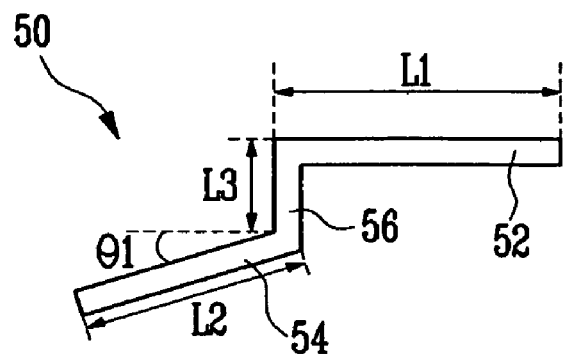
FIG. 2A illustrates a schematic, enlarged side view of a lead plate according to an embodiment.
Figure 2B:
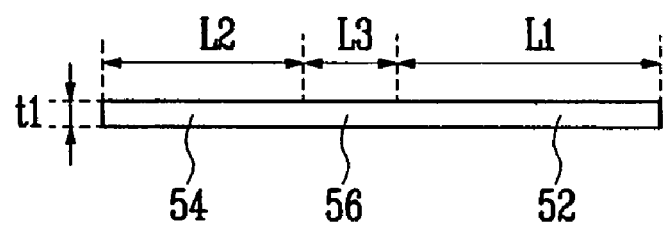
FIG. 2B illustrates a side view of a base material of the lead plate of FIG. 2A.
Figure 2C:
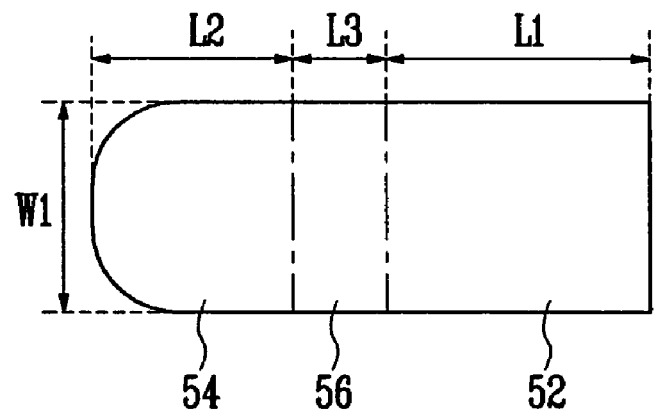
FIG. 2C illustrates a plan view of the base material of FIG. 2B.

In an embodiment, one end portion of the lead plate 50 may be formed in a curved shape, e.g., the joint portion 54 may be curved as illustrated in FIG. 2C. However, other geometrical configurations of the lead plate 50 are not excluded from example embodiments, e.g., an end portion of the lead plate 50 may have a rectangular shape such as a surface of a rectangular parallelepiped.

The protection circuit module 10 may have a pair of lead plates 50 at both ends in the length direction thereof. Alternatively, the protection circuit module 10 may have a dummy plate 51 at any one of both the ends. The dummy plate 51 may be identical to the lead plate 50, except that the dummy plate 51 may not be used as a current path through which the protection circuit module 10 is connected to the bare cell, e.g., when the protection circuit module 10 is used in a battery pack.

Hereinafter, the lead plate 50 will be described in more detail with reference to FIGS. 2A-2C. FIG. 2A illustrates a side view of the lead plate 50 according to an embodiment, FIG. 2B illustrates a side view of a base material of the lead plate of 50, and FIG. 2C illustrates a plan view of the base material of FIG. 2B.

Referring to FIG. 2A, the lead plate 50 may include the mounting portion 52 having a first length L1, the joint portion 54 having a second length L2, and the step portion 56 having a third length L3 to connect the mounting portion 52 and the joint portion 54 to each other in one direction. In this embodiment, the first length L1 may be longer than the second length L2.

The mounting portion 52 corresponds to a portion of the lead plate 50 that is joined with the substrate 20, e.g., through a reflow soldering process. The joint portion 54 corresponds to a portion of the lead plate 50 that contacts the bare cell when the protection circuit module 10 having the lead plate 50 is joined with the bare cell, e.g., by welding. The step portion 56 corresponds to a portion of the lead plate 50 that connects the mounting portion 52 and the joint portion 54. The step portion 56 may form a step with a predetermined height between the bare cell and the protection circuit module 10, when the protection circuit module 10 is joined with the bare cell. The step formed by the step portion 56 between the bare cell and the protection circuit module 10 may provide a space for forming the safety elements 32 and 34 on the protection circuit module 10.

The lead plate 50 may be formed by bending a conductive or metallic plate. For example, the conductive/metallic plate may be formed of nickel or a nickel alloy. For example, as illustrated in FIG. 2B, a conductive or metallic plate having an initial linear, flat structure may be bent twice in different directions from the length direction in order to form the lead plate 50 in FIG. 2A. In other words, the conductive/metallic plate in FIG. 2B may be bent twice in order to form the mounting portion 52 and the joint portion 54 that are bent relatively to the step portion 56 of the lead plate 50 in FIG. 2A. As illustrated in FIG. 2B, the metallic plate may have a substantially uniform thickness t1 and a length (L1+L2+L3). Further, as illustrated in FIG. 2C, the metallic plate may have a width W1. If the lead plate 50 is formed by bending the metallic plate twice in different directions, it may have a step shape. Thus, in the state that the mounting portion 52 is joined with the substrate 20, the joint portion 54 may be welded to the bare cell, e.g., to an external surface of a bare cell extending along a length direction of the substrate 20.

As further illustrated in FIG. 2A, the joint portion 54 of the lead plate 50 may be bent outward (left in the figure) at an obtuse angle with respect to the step portion 56. That is, the joint portion 54 may be positioned at a predetermined angle θ1 with respect to a normal to the step portion 56, so an angle between the step portion 56 and the joint portion 54 may be larger than a right angle by the predetermined angle θ1, i.e., an angle between the joint portion 54 and an extension of the step portion 56 may be smaller than a right angle by the predetermined angle θ1. The mounting portion 52 may be bent inward (right in the figure) to be approximately perpendicular to the step portion 56. According to such bent angles, when the mounting portion 52 is joined with the protection circuit module 10, as illustrated in FIGS. 1A and 1B, the joint portion 54 may be bent away from the protection circuit module 10, e.g., extend in the direction of about 8 o'clock while being inclined by the angle θ1 in the extension direction of the mounting portion 52.

According to this embodiment, the area at which the mounting portion 52 is connected to the protection circuit module 10 may be larger than the area at which the joint portion 54 is connected to the bare cell, so that the weight of the mounting portion 52 may be greater than that of the joint portion 54. In other words, the mounting portion 52 and the joint portion 54 may be formed of a same material and have a substantially same width and thickness, so the mounting portion 52 may be heavier than the joint portion 54 due to the larger length L1 of the mounting portion 52. Thus, when the protection circuit module 10 having the lead plate 50 is welded to the bare cell, it may be possible to prevent one side of the joint portion 54 from being inclined or lifted with respect to the joint surface. That is, weldability may be improved by using the lead plate 50 of this embodiment.

Figure 3:
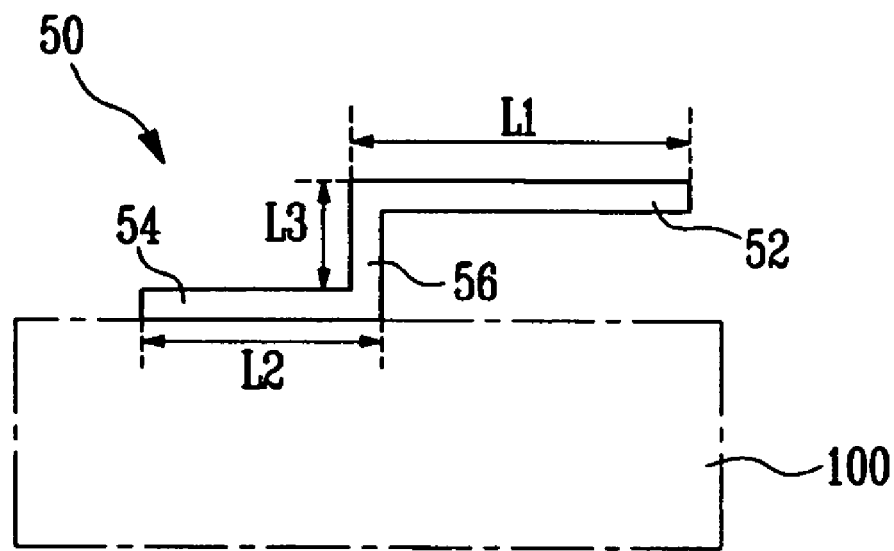
FIG. 3 illustrates a side view of a joined state of the lead plate of FIG. 2A.

FIG. 3 illustrates a side view of a joined state of the lead plate 50. When the protection circuit module 10 is joined with an bare cell, e.g., a bare cell 100, via the lead plate 50, the lead plate 50 may be compressed with a predetermined pressure on one surface of the bare cell 100 to weld the lead plate 50 to the bare cell 100. In detail, the mounting portion 52 of the lead plate 50 may be previously attached to the protection circuit module 10, e.g., an entire surface of the mounting portion 52 facing the substrate 20 of the protection circuit module 10 may be in direct contact therewith. Further, pressure may be applied to an interface between the joint portion 54 of the lead plate 50 and the bare cell 100, so the joint portion 54 may be attached parallel to the surface of the bare cell 100, as illustrated in FIG. 3.

That is, in the joint state of the lead plate 50 according to example embodiments, the mounting portion 52 may be joined parallel to one surface of the protection circuit module 10, and the joint portion 54 may be welded to the bare cell 100 by being attached parallel to the surface of the bare cell 100. Further, the step portion 56 may be formed to connect in the vertical direction between the mounting portion 52 and the joint portion 54, which extend parallel to each other, i.e., in the joined state. The joint state exhibits excellent reliability in the drop test of the battery pack.

In contrast, when a protection circuit module is welded to a bare cell by using a conventional lead plate, e.g., a lead plate including a joint portion that is longer than a mounting portion, the weight of the longer joint portion may be larger than that of the shorter mounting portion. As such, an edge of the longer joint portion may be inclined away from the bare cell, so weldability of the conventional lead plate to the bare cell 100 may be poor due to the larger weight of the joint portion. In other words, if the weight of the joint portion is greater than that of the mounting portion, a centroid, i.e., a center of mass, of the lead plate may be positioned at a boundary between the joint portion and a step portion. Therefore, when a force is applied to the boundary portion between the joint portion and the step portion, i.e., one end portion of the joint portion, in the length direction of the step portion during welding, the other end portion of the joint portion may be lifted to a predetermined height from the surface of the bare cell due to the strength or elasticity of the joint portion itself. In this case, when the conventional lead plate is joined with the bare cell 100 by a laser welding method, a hole may be produced in the joint portion of the lead plate, or the welding may not be properly performed. Therefore, a welding failure may easily occur.

Therefore, in the lead plate 50 according to example embodiments, the area of the mounting portion 52 facing the protection circuit module 10 may be larger than that of the joint portion 54, so that the weight of the mounting portion 52 may be greater than that of the joint portion 54. In this case, a center of mass of the lead plate 50 may be positioned between the boundary portion of the mounting portion 52 and the step portion 56, i.e., one end portion of the mounting portion 52, and the other end portion of the mounting portion 52. Thus, when a compression force is applied in the length direction of the step portion 56 when the lead plate 50 is welded to the bare cell 100, the compression force applied to one end portion of the joint portion 54 is distributed over the entire joint portion 54, as the center of mass is positioned on the mounting portion 52. Accordingly, it may be possible to prevent the other portion of the joint portion 54 from being inclined.

In the following embodiments, various shapes of lead plates will be described. For convenience of illustration, in some embodiments, a base material of a lead plate is referred to as a lead plate manufactured by the base material, and is designated by reference numeral (one of 50a to 50g).

Figure 4:
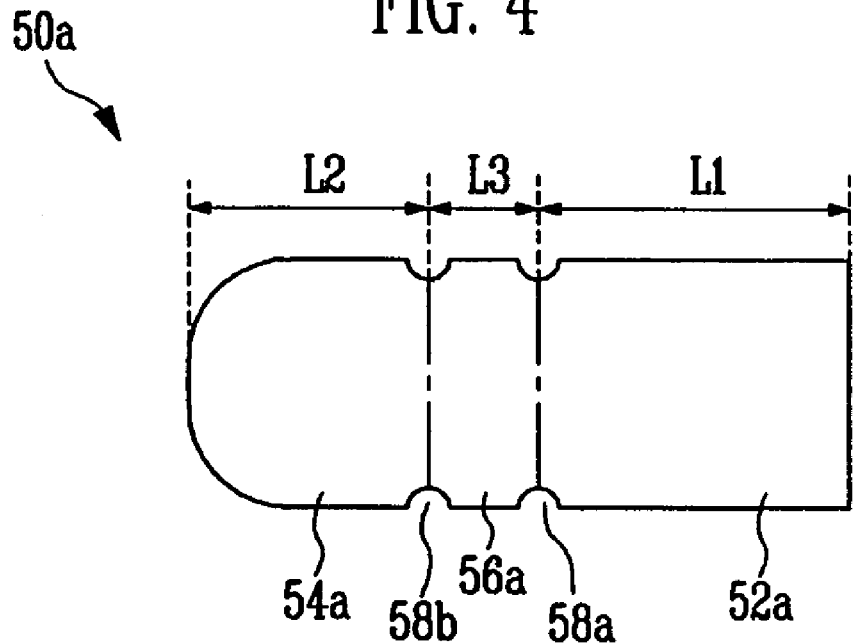
FIG. 4 illustrates a plan view of a base material of a lead plate according to another embodiment.

FIG. 4 illustrates a plan view of a base material of a lead plate according to another embodiment. Referring to FIG. 4, a lead plate 50a may include a mounting portion 52a having a first length L1, a joint portion 54a having a second length L2, a step portion 56a having a third length L3 to connect the mounting portion 52a and the joint portion 54a to each other, and at least one notch, e.g., first notch 58a and/or second 58b. In this embodiment, the width and thickness of the lead plate 50a may be constant, and the first length L1 may be longer than the second length L2.

In detail, the first notch 58a may be positioned at one end or both ends in the width direction of the base material of the lead plate 50a, i.e., on a boundary portion (or first bending portion) of the mounting portion 52a and the step portion 56a. The second notch 58b may be positioned at one end or both ends in the width direction of the base material of the lead plate 50a on a boundary portion (or second bending portion) of the joint portion 54a and the step portion 56a. The first notch 58a may facilitate the bending of the mounting portion 52a and the step portion 56a, and the second notch 58b may facilitate the bending of the joint portion 54a and the step portion 56a.

Figure 5:
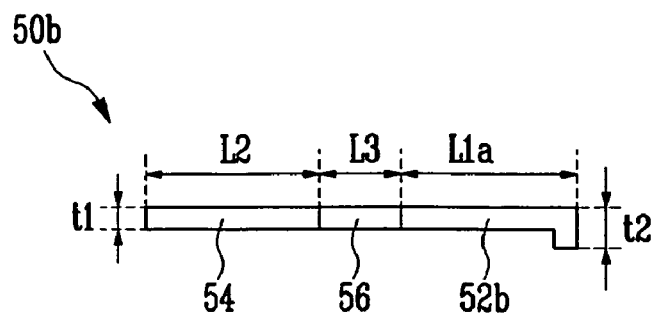
FIG. 5 illustrates a side view of a base material of a lead plate according to still another embodiment.

FIG. 5 illustrates a side view of a base material of a lead plate according to still another embodiment. Referring to FIG. 5, a lead plate 50b may include a mounting portion 52b having a first length L1a, the joint portion 54 having the second length L2, and the step portion 56 having the third length L3 to connect to the mounting portion 52b and the joint portion 54 to each other. The mounting portion 52b may have a non-uniform thickness, so a first portion having a first thickness t1 may be thinner than a second portion having a second thickness t2. It is noted that thicknesses of the joint portion 54 and step portion 56 may be substantially uniform, and may have the first thickness t1. In this embodiment, when assuming that the width of the lead plate 50b is constant and the first and second lengths L1a and L2 are identical to each other, the weight of the mounting portion 52b may be greater than that of the joint portion 54 due to the different thicknesses of the mounting portion 52b. In other words, according to this embodiment, a larger thickness of the mounting portion 52b may be used, so that the weight of the mounting portion 52b may be greater than that of the joint portion 54.

Figure 6:
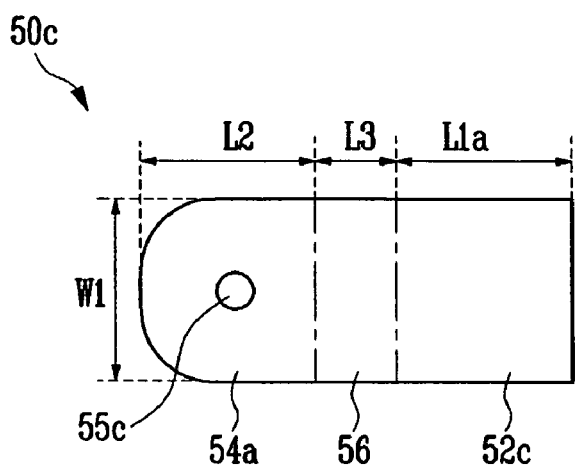
FIG. 6 illustrates a plan view of a base material of a lead plate according to still another embodiment.

FIG. 6 illustrates a plan view of a base material of a lead plate according to still another embodiment. Referring to FIG. 6, a lead plate 50c may include a mounting portion 52c having the first length L1a, the joint portion 54a having the second length L2, and the step portion 56 having the third length L3 to connect the mounting portion 52c and the joint portion 54a to each other. The joint portion 54a may have an opening 55c, i.e., a portion of the joint portion 54a may be removed. In this embodiment, when assuming that the width of the lead plate 50c is constant and the first and second lengths L1a and L2 are identical to each other, the weight of the mounting portion 52c may be greater than that of the joint portion 54a due to the opening 55c. In other words, a contact area of the mounting portion 52c with the protection circuit module 10 may be larger than the area of the joint portion 54a by forming the opening 55c.

According to this embodiment, the opening 55c of the joint portion 54a may be used, so that the weight of the mounting portion 52c may be greater than that of the joint portion 54a. It will be apparent that the shape and the position of the opening 55c may be arbitrarily controlled considering the welding point of the joint portion 54a.

Figure 7:
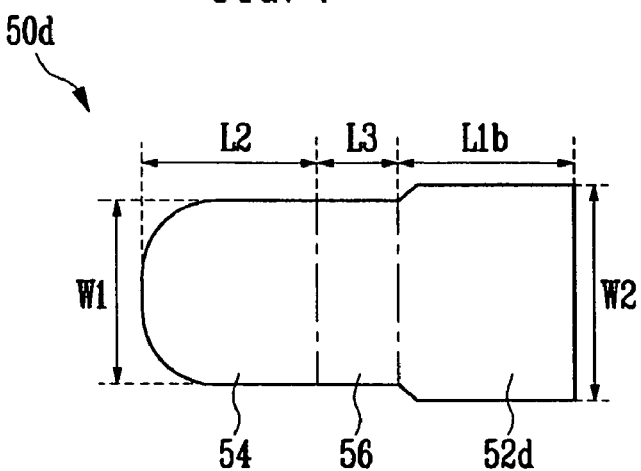
FIG. 7 illustrates a plan view of a base material of a lead plate according to still another embodiment.

FIG. 7 illustrates a plan view of a base material of a lead plate according to still another embodiment. Referring to FIG. 7, a lead plate 50d may include a mounting portion 52d having a first length L1b, the joint portion 54 having the second length L2, and the step portion 56 having the third length L3 to connect the mounting portion 52d and the joint portion 54. A width W2 of the mounting portion 52d may be wider than the width W1 of the joint portion 54. In this embodiment, when assuming that the thickness of the lead plate 50 is substantially constant and the first and second lengths L1b and L2 are identical to each other, the weight of the mounting portion 52d may be greater than that of the joint portion 54 due to the width difference. In other words, according to this embodiment, the width of the mounting portion 52d, which is wider than that of the joint portion 54, may be used so that the weight of the mounting portion 52d may be greater than that of the joint portion 54.

When the width of the mounting portion 52d is wider than that of the joint portion 54, a portion extending outward from the protection circuit module 10 may not contact the protection circuit module 10. Here, the mounting portion 52d may be divided into a contact region at which it comes in contact with the protection circuit module 10 and a non-contact region at which it does not come in contact with the protection circuit module 10.

Although an area of the contact region of the mounting portion 52d with the protection circuit module 10 may be the same as or smaller than that of the joint portion 54, an entire area of the mounting portion 52d may be larger than that of the joint portion 54. Therefore, the weight of the mounting portion 52d may be greater than that of the joint portion 54. That is, in this embodiment, when the mounting portion 52d is divided into a contact region at which it comes in contact with the protection circuit module 10 and a non-contact region that is extended outward from the protection circuit module 10 and not coming in contact with the protection circuit module 10, the contact area of the mounting portion 52d may be the same as or smaller than that of the joint portion 54. For example, the area of the contact region of the mounting portion 52d may be relatively smaller than that of the joint portion 54, thereby preventing problems, e.g., welding failures. Further, the non-contact region of the mounting portion 52d may be formed so that the entire area of the mounting portion 52d is larger than that of the joint portion 54, i.e., so that the weight of the mounting portion 52d is greater than that of the joint portion 54, thereby enhancing the joint strength of the protection circuit module 10. Thus, the reliability of the battery pack may be enhanced. In this embodiment, assuming that the weight of the mounting portion 52d is greater than that of the joint portion 54, the first length L1b may be formed slightly shorter than the second length L2.

Figure 8A:
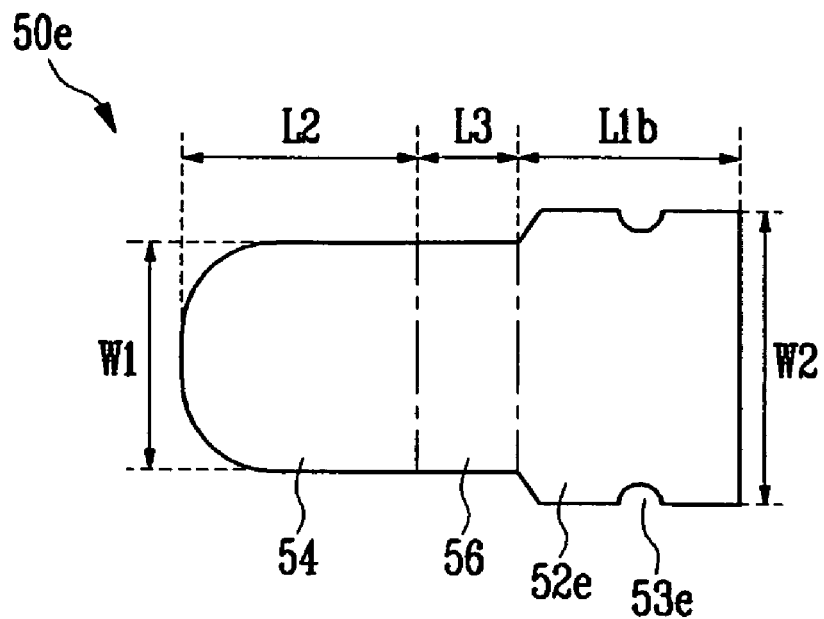
FIG. 8A illustrates a plan view of a base material of a lead plate according to still another embodiment.
Figure 8B:
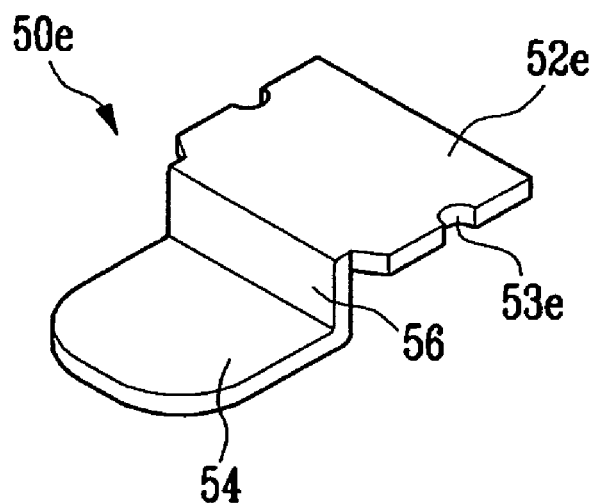
FIG. 8B illustrates a perspective view of the lead plate made of the base material of FIG. 8A.

FIG. 8A illustrates a plan view of a base material of a lead plate according to still another embodiment. FIG. 8B illustrates a perspective view of the lead plate made of the base material of FIG. 8A.

Referring to FIGS. 8A and 8B, a lead plate 50e may include a mounting portion 52e having a first length L1b, the joint portion 54 having the second length L2, and the step portion 56 having the third length L3 to connect the mounting portion 52e and the joint portion 54 to each other. The width W2 of the mounting portion 52e may be wider than the width W1 of the joint portion 54. The mounting portion 52e may have at least one notch 53e positioned at one end or both ends in the width direction of the lead plate 50e. In this embodiment, when assuming that the thickness of the lead plate 50e is substantially constant, and the first and second lengths L1b and L2 are identical to each other, the entire area of the mounting portion 52e may be larger than that of the joint portion 54, and therefore, the weight of the mounting portion 52e may be different from that of the joint portion 54.

The notch 53e may be provided to enhance the joining of the mounting portion 52e. That is, when the mounting portion 52e is joined with the protection circuit module 10 by a reflow soldering method, the notch 53e may increase the tension of the mounting portion 52e so that the lead plate 50e can be well welded to the protection circuit module.

Figure 9A:
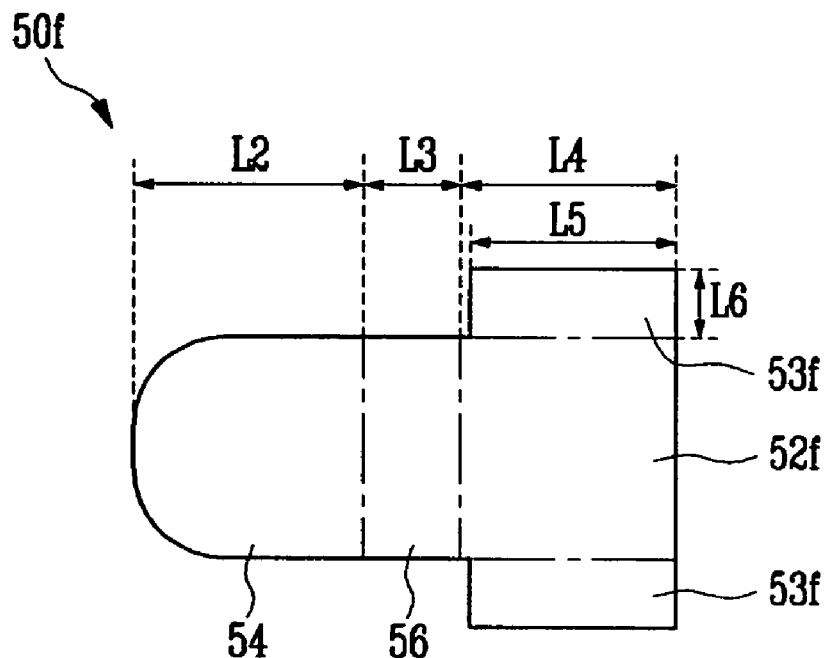
FIG. 9A illustrates a plan view of a base material of a lead plate according to still another embodiment.
Figure 9B:
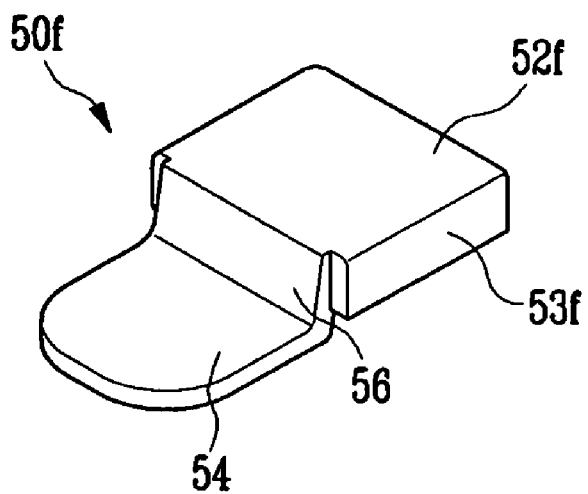
FIG. 9B illustrates a perspective view of the lead plate made of the base material of FIG. 9A.

FIG. 9A illustrates a plan view of a base material of a lead plate according to still another embodiment. FIG. 9B illustrates a perspective view of the lead plate made of the base material of FIG. 9A.

Referring to FIGS. 9A and 9B, a lead plate 50f may include a mounting portion 52f having a first length L4, the joint portion 54 having the second length L2, and the step portion 56 having the third length L3 to connect the mounting portion 52f and the joint portion 54 to each other. The lead plate 50f may also include a wing portion 53f having a fourth length L5 in the length direction and a fifth length L6 in the width direction of the mounting portion 52f. As described previously, the wing portion 53f may be a non-contact region bent to extend outward from a contact region at which the mounting portion 52f comes in contact with the protection circuit module 10 in the entire area of the mounting portion 52f.

The wing portion 53f may be folded once in the folded direction of the step portion 56 from one end of the mounting portion 52f, and the fifth length L6 may be formed shorter than the third length L3 of the step portion 56. The fourth length L5 of the wing portion 53f may be identical to or slightly shorter than the first length L4 of the mounting portion 52f. Since the wing portion 53f is connected only to the mounting portion 52f, it may function to increase the weight of the mounting portion 52f.

In this embodiment, the weight of the mounting portion 52f connected to the wing portion 53f may be greater than that of the joint portion 54, even when the thickness of the lead plate 50f is substantially constant and the first length L4 is identical to or slightly shorter than the second length L2. Further, in this embodiment, it may be possible to prevent the lead plate 50f from being collapsed by the wing portion 53f of the lead plate 50f, even when an impact is applied to a corner portion of the battery pack in the drop test of the battery pack, in which the bare cell and the protection circuit module are joined together using the lead plate 50f.

Figure 10A:
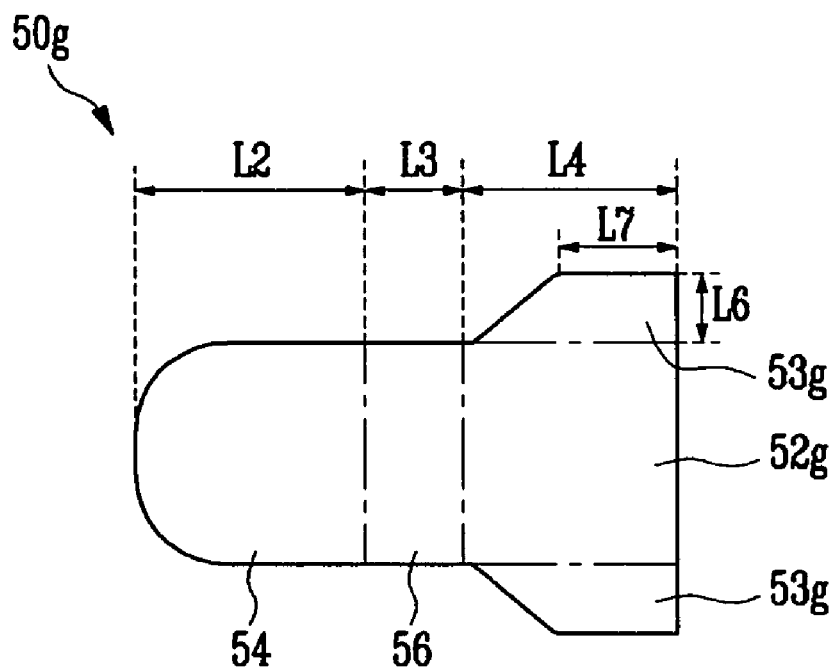
FIG. 10A illustrates a plan view of a base material of a lead plate according to still another embodiment.
Figure 10B:
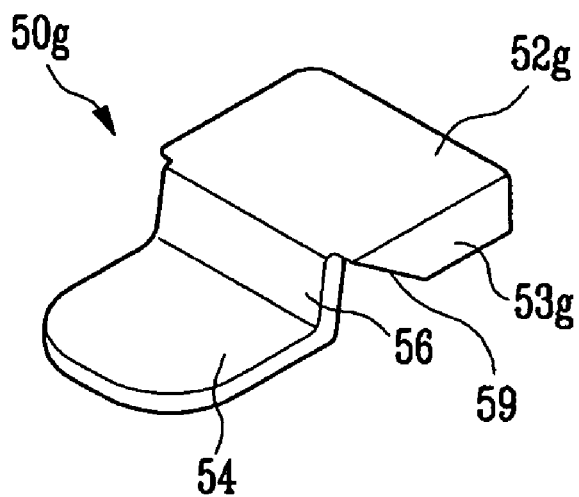
FIG. 10B illustrates a perspective view of the lead plate made of the base material of FIG. 10A.

FIG. 10A illustrates a plan view of a base material of a lead plate according to still another embodiment. FIG. 10B illustrates a perspective view of the lead plate made of the base material of FIG. 10A.

Referring to FIGS. 10A and 10B, a lead plate 50g may include a mounting portion 52g having the first length L4, the joint portion 54 having the second length L2, and the step portion 56 having the third length L3 to connect the mounting portion 52g and the joint portion 54 to each other. The lead plate 50g may also include a wing portion 53g having a sixth length L7 in the length direction and the fifth length L6 in the width direction of the mounting portion 52g.

Since the wing portion 53g is connected only to the mounting portion 52g, it may function to increase the weight of the mounting portion 52g. In this embodiment, the weight of the mounting portion 52 connected to the wing portion 53g may be greater than that of the joint portion 54, even when the thickness of the lead plate 50g is substantially constant and the first length L4 is identical to or slightly shorter than the second length L2 so that the entire area is changed.

The wing portion 53g may be folded once in the folded direction of the step portion 56 from one end of the mounting portion 52g, and the fifth length L6 of the wing portion 53g may be formed shorter than the third length L3 of the step portion 56. The wing portion 53g may have a slope portion 59 formed at the side adjacent to the step portion 56. The slope portion 59 may be formed so that the length of the wing portion 53g in the length direction of the lead plate 50g is decreased from the length identical to or slightly shorter than the first length L4 of the mounting portion 52g to the sixth length L7, while extending in the width direction of the lead plate 50g from the mounting portion 52g.

When the bending portion of the joint portion 54 and the step portion 56 is folded at an acute angle, i.e., smaller than 90 degrees, because a compression force applied to the lead plate is slightly large when the protection circuit module is joined with the bare cell, the slope portion 59 may function to prevent the interference between the step portion 56 and the wing portion 53g.

According to the lead plates 50a to 50g of the aforementioned embodiments, the weight of the mounting portion may be greater than that of the joint portion, so that it may be possible to prevent the joint portion from being inclined from the surface of the bare cell due to the movement of a centroid of the lead plate to the joint portion when the protection circuit module is welded to the bare cell. That is, according to example embodiments, the welding strength of the lead plate may be increased, so that it may be possible to prevent the lead plate from being collapsed or to prevent a welding portion from easily coming off by an impact applied to the corner portion of the battery pack in the drop test.

Figure 11A:
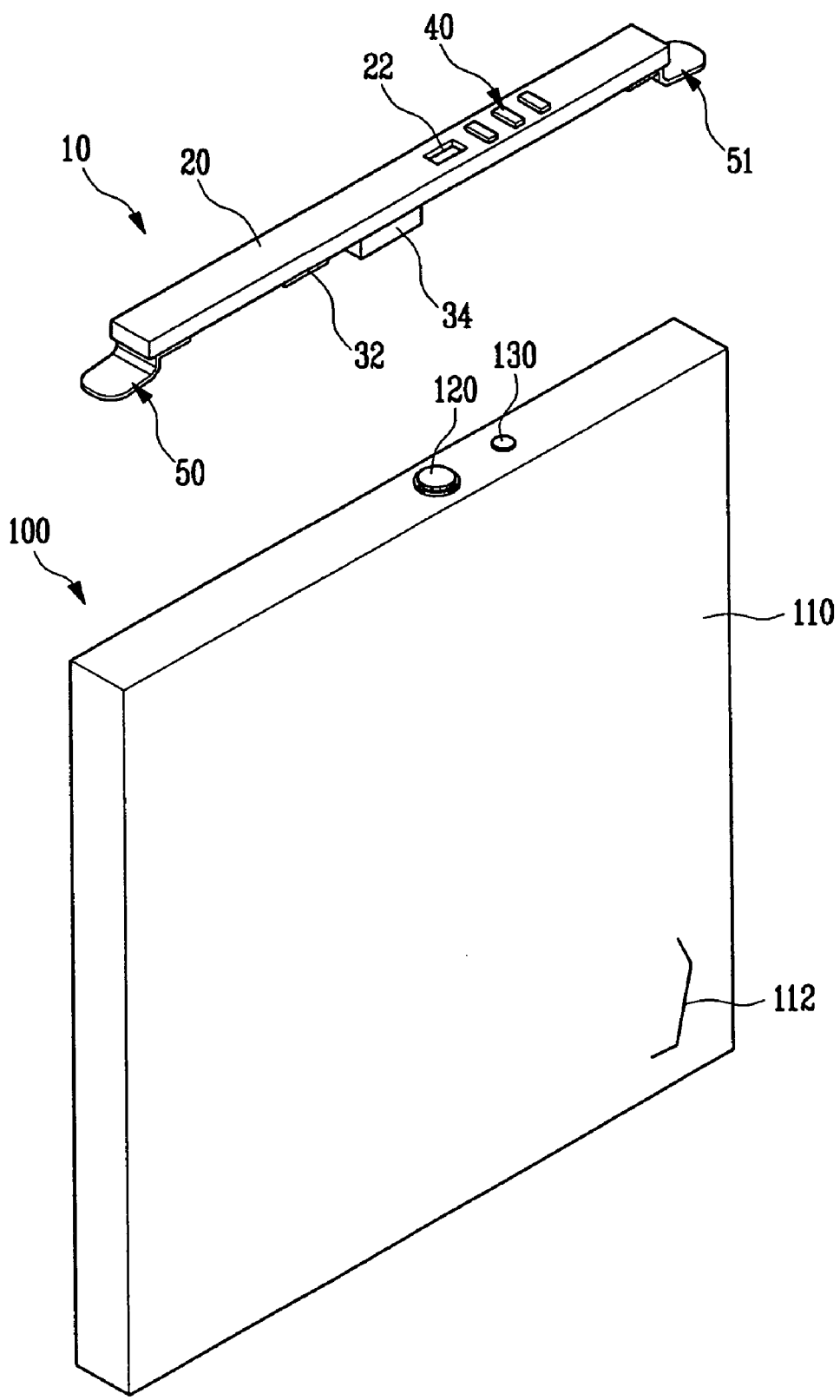
FIGS. 11A and 11B illustrate perspective, sequential views of processes in a method of manufacturing a battery pack according to an embodiment.
Figure 11B:
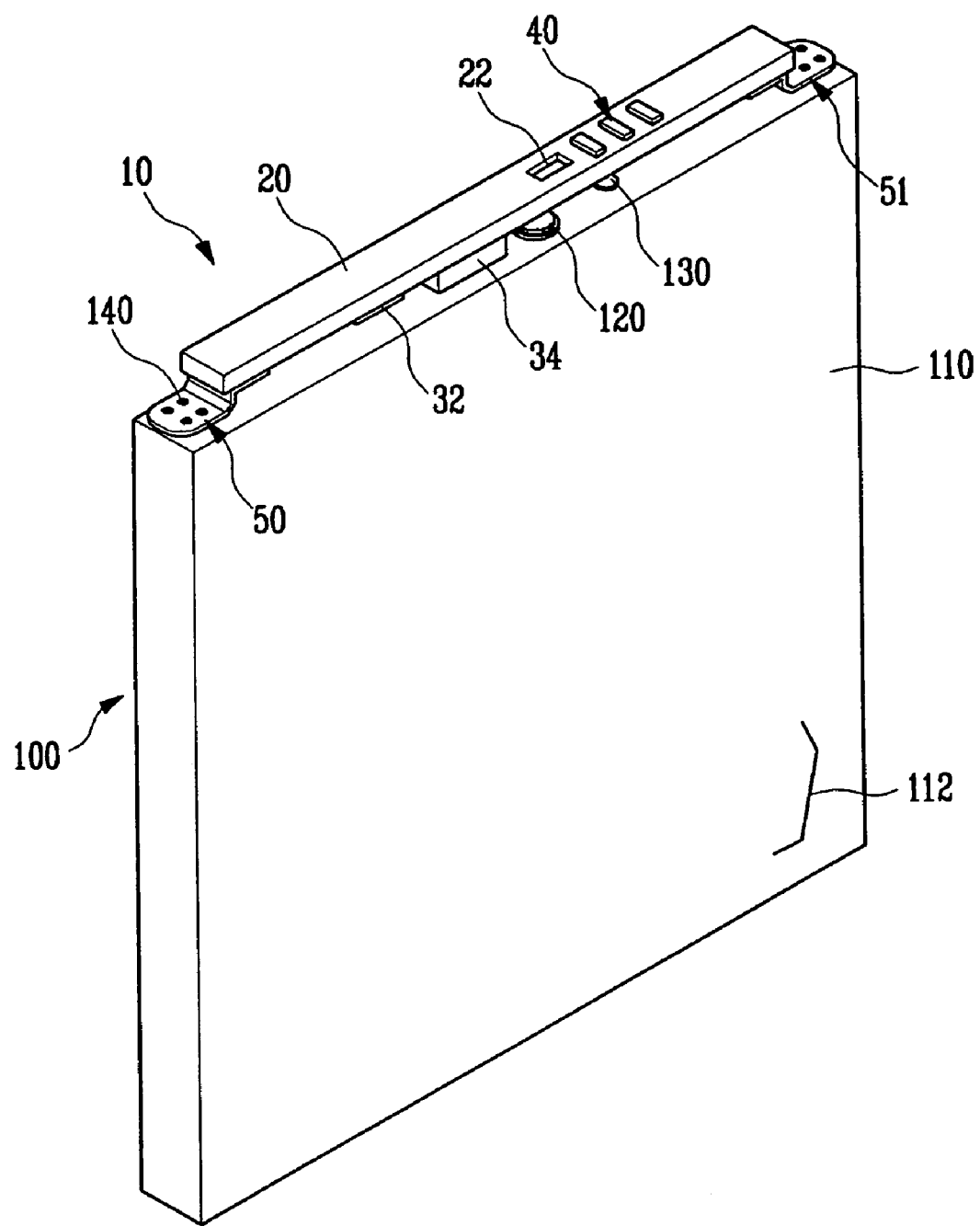

FIGS. 11A and 11B illustrate perspective views of sequential processes in a method of manufacturing a battery pack according to an embodiment. Referring to FIGS. 11A and 11B, a protection circuit module 10 may be prepared. Here, the lead plate 50 and the dummy plate 51 may be connected to the protection circuit module 10. The bare cell 100 may also be prepared.

The lead plate 50 and dummy plate 51 of the protection circuit module 10 correspond to the lead plates described with reference to FIGS. 1A and 1B. Each of the lead plate 50 and the dummy plate 51 may be replaced with any one of the lead plates 50a to 50g of the aforementioned embodiments or a combination thereof.

The protection circuit module 10 may be laser-welded to the top surface of the bare cell 100. Welding points 140 may be formed on the lead plate 50 and the dummy plate 51 by the laser welding. The top surface of the bare cell 100 corresponds to a side surface on which a negative electrode terminal 120 and an electrolyte injection hole 130 are formed. The electrolyte injection hole 130 may be sealed after an electrolyte is injected into the bare cell 100 therethrough.

According to this embodiment, when the top surface of the bare cell 100 is compressed by the protection circuit module 10 in the laser welding, the joint portion of each of the lead plate 50 and the dummy plate may not be inclined or lifted from the top surface of the bare cell 100. Thus, the welding process may be stably performed.

The bare cell 100 may include a can type case 110, and an electrode assembly (not shown) and an electrolyte (not shown) accommodated in the case. A safety vent 112 for discharging an internal gas in an increase of internal pressure may be formed at one side surface of the case 110.

The electrode assembly may be formed by using a stacked body or winding the stacked body. Here, the stacked body may be formed by sequentially stacking a positive electrode plate, a separator, and a negative electrode plate. The electrolyte assembly may have positive and negative electrode tabs respectively attached to the positive and negative electrode plates. The positive electrode tab may be electrically connected to the case 110, and the negative electrode tab may be electrically connected to the electrode terminal 120. The electrolyte may be a solid polymer electrolyte or gel polymer electrolyte.

The positive electrode plate may have a sheet-shaped positive electrode collector and a positive electrode active material coated on the positive electrode collector. The negative electrode plate may have a sheet-shaped negative electrode collector and a negative electrode active material coated on the negative electrode collector.

The positive electrode active material may include a transition metal oxide containing lithium, representative of metal oxides, e.g., $LiCoO_2$, $LiNiO_2$, $LiMnO_2$, $LiMn_2O_4$ and $LiNi_{1-x-y}Co_xM_yO_2$ ($0 \leq x \leq 1$, $0 \leq y \leq 1$, $0 \leq x+y \leq 1$, and M is a metal, such as Al, Sr, Mg or La), or a lithium chalcogenide compound. The negative electrode active material may be a carbon material, e.g., crystalline carbon, amorphous carbon, carbon composite or carbon fiber, a lithium metal or a lithium alloy.

The positive and negative electrode collectors may be formed of one or more of stainless steel, nickel, copper, aluminum and alloy thereof. In order to maximize efficiency, the positive electrode collector may be formed of aluminum or aluminum alloy, and the negative electrode collector may be formed of copper or copper alloy.

The separator may be positioned between the positive and negative electrode plates. The separator may be formed to prevent an electrical short circuit between the positive and negative electrode plates and to allow the movements of lithium ions. The separator may be formed of a polymer film, e.g., polyethylene (PE), polypropylene (PP), polyolefin, or a multi-layered film thereof.

The battery pack of this embodiment may include a holder frame for supporting the protection circuit module 10 at one side of the bare cell 100, a cover frame fixed to the holder frame while surrounding the protection circuit module 10, and an outer label for surrounding the bare cell 100 and the holder frame. A water sensitive paper may be provided to the cover frame.

According to example embodiments, in a protection circuit module or a battery pack having the same, it may be possible to enhance the joint strength between a bare cell and the protection circuit module by using a lead plate having a mounting portion that is heavier than the joint portion. Further, a joining process of the bare cell and the protection circuit module may be easily performed by a laser soldering method, and the failure rate in the joining process may be decreased. Furthermore, the joint strength between the bare cell and the protection circuit module may be improved, thereby enhancing the drop reliability of the battery pack. In addition, the joining between the bare cell and a lead plate, e.g., a nickel tab, serving as a current path of the protection circuit module may be improved, thereby enhancing the performance and reliability of the battery pack.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A secondary battery, comprising:
   a bare cell;
   a protection circuit module on the bare cell; and
   a lead plate joined with the protection circuit module, the lead plate including;
      a mounting portion connected to a printed circuit board (PCB) in the protection circuit module,
      a joint portion connected to the bare cell, the mounting portion being heavier than the joint portion, and a surface area of the joint portion facing the bare cell being smaller than a surface area of the mounting portion facing the PCB, and
      a step portion connecting the mounting portion and the joint portion to each other.

2. The secondary battery as claimed in claim 1, wherein the mounting portion includes a contact region and a non-contact region, the contact region contacting a surface of the PCB, and a surface area of the contact region being smaller than the surface area of the joint portion facing the bare cell.

3. The secondary battery as claimed in claim 2, wherein the non-contact region of the mounting portion extends away from the contact region.

4. The secondary battery as claimed in claim 2, wherein the non-contact region has a wing portion bent and extended outward from the contact region.

5. The secondary battery as claimed in claim 4, wherein a length of the wing portion is shorter than that of the step portion.

6. The secondary battery as claimed in claim 4, wherein a width of the wing portion decreases in a direction extending outward from the mounting portion, the wing portion being spaced apart from the step portion at a predetermined interval.

7. The secondary battery as claimed in claim 1, wherein a first boundary portion between the mounting portion and the step portion and a second boundary portion between the step portion and the joint portion are bent, at least one of the first and second boundary portions including a notch.

8. The secondary battery as claimed in claim 1, wherein the mounting portion includes a first portion having a first thickness and a second portion having a second thickness different than the first thickness, at least one of the first and second portions of the mounting portion being thicker than the joint portion.

9. The secondary battery as claimed in claim 1, wherein a width of the mounting portion is larger than a width of the joint portion.

10. The secondary battery as claimed in claim 1, wherein the joint portion includes an opening.

11. The secondary battery as claimed in claim 1, wherein the mounting portion and the joint portion directly contact the PCB and the bare cell, respectively, the PCB being parallel to an upper surface of the bare cell, and the step portion extending at an angle other than 0° or 180° with respect to each of the PCB and the upper surface of the bare cell to define a space between the PCB an the bare cell.

12. The secondary battery as claimed in claim 1, wherein the entire protection circuit module is external to the bare cell, the lead plate being between a lowermost surface of the protection circuit module and an uppermost surface of the bare cell, and the lowermost surface of the protection circuit module and the uppermost surface of the bare cell facing opposite directions.

13. The secondary battery as claimed in claim 1, wherein the mounting portion is between the protection circuit module and the bare cell.

14. A protection circuit module, comprising:
a printed circuit board (PCB);
a safety element and an external connection terminal on the PCB; and
a lead plate joined with the PCB, the lead plate including:
a mounting portion connected to the PCB,
a joint portion connected to a bare cell, a surface area of the joint portion facing the bare cell being smaller than a surface area of the mounting portion facing the PCB, and
a step portion connecting the mounting portion and the joint portion to each other.

15. The protection circuit module as claimed in claim 14, wherein the mounting portion includes a contact region and a non-contact region, the contact region contacting a surface of the PCB, and the surface area of the contact region being smaller than the surface area of the joint portion facing the bare cell.

16. The protection circuit module as claimed in claim 14, wherein a first boundary portion between the mounting portion and the step portion and a second boundary portion between the step portion and the joint portion are bent, and at least one of the first and second boundary portions includes a notch.

17. The protection circuit module as claimed in claim 14, wherein the mounting portion includes a first portion having a first thickness and a second portion having a second thickness different than the first thickness, at least one of the first and second portions of the mounting portion being thicker than the joint portion.

18. The protection circuit module as claimed in claim 14, wherein the mounting portion is heavier than the joint portion.

19. The protection circuit module as claimed in claim 14, wherein the step portion extends at an angle other than 0° or 180° with respect to each of the PCB and the bare cell to define a space between the PCB an the bare cell, the safety element and external connection terminal being in the space between the PCB an the bare cell.

20. The protection circuit module as claimed in claim 14, wherein the entire protection circuit module is external to the bare cell, the mounting portion being between the protection circuit module and the bare cell.

* * * * *